(12) United States Patent
Suh et al.

(10) Patent No.: US 9,508,873 B2
(45) Date of Patent: Nov. 29, 2016

(54) SCHOTTKY DIODE AND METHOD OF FABRICATING THE SAME

(71) Applicants: Electronics and Telecommunications Research Institute, Daejeon (KR); THE REGENTS OF THE UNIVERSITY OF MICHIGAN, Ann Arbor, MI (US)

(72) Inventors: Dongwoo Suh, Daejeon (KR); Young Jun Kim, Daejeon (KR); Wei Lu, Ann Arbor, MI (US); Lin Chen, Ann Arbor, MI (US)

(73) Assignees: ELECTRONICS AND TELECOMMUNICATIONS RESEARCH INSTITUTE, Daejeon (KR); NATIONAL SCIENCE FOUNDATION, Arlington, VA (US)

(*) Notice: Subject to any disclaimer, the term of this patent is extended or adjusted under 35 U.S.C. 154(b) by 67 days.

(21) Appl. No.: 14/339,915

(22) Filed: Jul. 24, 2014

(65) Prior Publication Data
US 2015/0155395 A1 Jun. 4, 2015

(30) Foreign Application Priority Data
Dec. 3, 2013 (KR) ........................ 10-2013-0149225

(51) Int. Cl.
H01L 29/40 (2006.01)
H01L 29/872 (2006.01)
H01L 29/06 (2006.01)
H01L 29/41 (2006.01)
H01L 29/66 (2006.01)
H01L 29/205 (2006.01)
H01L 29/20 (2006.01)

(52) U.S. Cl.
CPC .......... *H01L 29/872* (2013.01); *H01L 29/068* (2013.01); *H01L 29/0676* (2013.01); *H01L 29/205* (2013.01); *H01L 29/413* (2013.01); *H01L 29/66212* (2013.01); *H01L 29/2003* (2013.01)

(58) Field of Classification Search
CPC .......... H01L 29/872; H01L 29/66143; H01L 29/0676; H01L 29/16; H01L 29/068
See application file for complete search history.

(56) References Cited

U.S. PATENT DOCUMENTS

| | | | | |
|---|---|---|---|---|
| 6,229,165 B1* | 5/2001 | Sakai | .................. | H01L 27/1443 257/290 |
| 2010/0270589 A1 | 10/2010 | Suh et al. | | |
| 2011/0036396 A1* | 2/2011 | Jayaraman | .............. | B82Y 10/00 136/255 |

(Continued)

FOREIGN PATENT DOCUMENTS

| | | |
|---|---|---|
| KR | 10-2012-003463 A | 1/2012 |
| KR | 10-2013-0093209 A | 8/2013 |
| WO | WO-2010/110733 A1 | 9/2010 |

OTHER PUBLICATIONS

Chung et al., "Silicon Nanowire devices" Appl. Phy. letter, 2000.*

(Continued)

*Primary Examiner* — Ahmed Sefer
(74) *Attorney, Agent, or Firm* — Rabin & Berdo, P.C.

(57) ABSTRACT

Provided is a Schottky diode. The Schottky diode includes: a substrate; a core on the substrate; a metallic layer on the core; and a shell surrounding the core between the metallic layer and the substrate and adjusting a Fermi energy level of the core to form a Schottky junction between the core and the metallic layer.

15 Claims, 6 Drawing Sheets

(56) References Cited

U.S. PATENT DOCUMENTS

| | | | |
|---|---|---|---|
| 2011/0089477 A1* | 4/2011 | Wernersson | B82Y 10/00 257/312 |
| 2012/0012968 A1* | 1/2012 | Konsek | H01L 29/0673 257/472 |
| 2012/0280347 A1 | 11/2012 | Suh et al. | |

OTHER PUBLICATIONS

Wittmer et al., "Ideal Schottky Diodes on Passivated Silicon" American Physical Society, 1992.*

Cheol-Joo Kim et al., "Diameter-Dependent Internal Gain in Ohmic Ge Nanowire Photodetectors", Nano Letters, vol. 10, pp. 2043-2048, Apr. 2010.

* cited by examiner

SCHOTTKY DIODE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2013-0149225, filed on Dec. 3, 2013, the entire contents of which are hereby incorporated by reference.

BACKGROUND OF THE INVENTION

The present invention disclosed herein relates to a diode and a method of fabricating the same, and more particularly, to the Schottky diode using a nanowire and a method of fabricating the same.

A nanowire may have a mesoscopic size between a microscopic size and an atomic size. For example, the nanowire has a quasi one-dimensional structure of a rod shape with the diameter of less than about 100 nm. Among nanowires, a semiconductor nanowire has a variety of applicability in the fields of an electronic device and an optical device due to characteristics such as quantum confinement and ballistic transport.

The nanowire may be formed through a top-down method or a bottom-up method. The top-down method is a method of etching a substrate by dry or wet etch process after forming a patterned mask on the substrate. The bottom-up method is a method of growing a nanowire on a substrate by using a seed and a source gas.

The semiconductor nanowire fabricated in such a manner operates as an electronic device only if doped with a impurity. However, since it is difficult to obtain a uniform distribution of dopant in a nanowire, a impurity doping process is the cause of degradation of the characteristics of the nanowire.

For example, a typical method of fabricating the Schottky diode may include a doping process of a p-type or n-type impurity after forming a semiconductor nanowire. However, since a impurity is not uniformly distributed in a semiconductor nanowire and segregated at the surface of the semiconductor nanowire, the performance of the Schottky diode may be degraded.

SUMMARY OF THE INVENTION

The present invention provides the Schottky diode undoped with a impurity and a method of fabricating the same.

Embodiments of the inventive concept provide Schottky diodes including: a substrate; a core on the substrate; a metallic layer on the core; and a shell surrounding the core between the metallic layer and the substrate and adjusting a Fermi energy level of the core to form a Schottky junction between the core and the metallic layer.

In some embodiments, the core may include a first semiconductor nanowire extending vertically to the substrate.

In other embodiments, the shell may include a second semiconductor nanowire having a different energy band gap from the first semiconductor nanowire and forming a heterojunction structure staggered with the first semiconductor nanowire.

In still other embodiments, each of the first semiconductor nanowire and the second semiconductor nanowire may include an intrinsic semiconductor.

In even other embodiments, the second semiconductor nanowire may include an intrinsic silicon nanowire.

In yet other embodiments, the first semiconductor nanowire may include an intrinsic germanium nanowire.

In further embodiments, the shell may include a first dielectric layer inducting a surface Fermi energy pinning effect with respect to the first semiconductor nanowire.

In still further embodiments, the first dielectric layer may include an oxide layer, a nitride layer or a compound layer.

In even further embodiments, the first semiconductor nanowire may include an intrinsic germanium nanowire or an intrinsic silicon nanowire of which Fermi energy level is adjusted by the surface pinning effect or the surface Fermi energy pinning effect.

In yet further embodiments, the Schottky diodes may further include at least one insulating interlayer disposed between the metallic layer and the substrate to surround the shell.

In yet further embodiments, the insulating interlayer may include a first insulating layer surrounding a sidewall of the core or the shell and a second insulating layer surrounding a sidewall of the first insulating layer.

In yet further embodiments, the metallic layer may extend from a top of the core to an external sidewall of the core or the shell.

In yet further embodiments, the metallic layer may include: a first metallic layer on the core or/and the shell; and a second metallic layer on the first metallic layer, wherein the first metallic layer may form the Schottky junction with respect to the core or/and the shell.

In yet further embodiments, the Schottky diodes may further include an interfacial layer disposed between the core and the metallic layer.

In yet further embodiments, the interfacial layer may include a second dielectric layer.

In other embodiments of the inventive concept, methods of fabricating a Schottky diode include: forming a core on a substrate; forming a shell surrounding the core; and forming a metallic layer on the shell and the core, wherein the core forms a Schottky junction with the metallic layer by adjusting a Fermi energy level through the shell without being doped with a impurity.

In some embodiments, the core may include an intrinsic germanium nanowire formed through a vapor-liquid-solid (VLS) growth method.

In other embodiments, the shell may include an intrinsic silicon formed through a chemical vapor deposition method or an atomic layer deposition method.

In still other embodiments, the methods may further include forming an insulating interlayer surrounding the shell.

BRIEF DESCRIPTION OF THE DRAWINGS

The accompanying drawings are included to provide a further understanding of the present invention, and are incorporated in and constitute a part of this specification. The drawings illustrate exemplary embodiments of the inventive concept and, together with the description, serve to explain principles of the present invention. In the drawings.

DETAILED DESCRIPTION OF PREFERRED EMBODIMENTS

Figure 1:
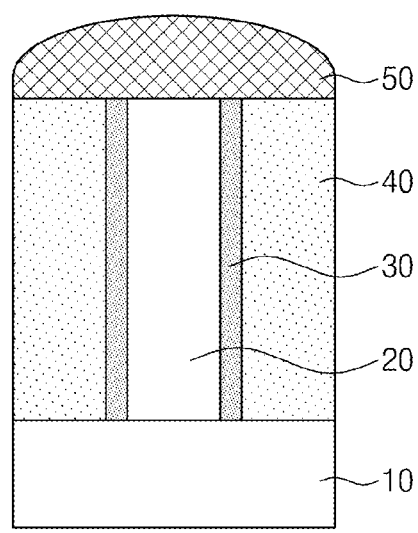
FIG. 1 is a view illustrating the Schottky diode according to an embodiment of the inventive concept.

Preferred embodiments of the inventive concept will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Like reference numerals refer to like elements throughout.

In the following description, the technical terms are used only for explaining specific embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto.

Hereinafter, it will be described about an exemplary embodiment of the inventive concept in conjunction with the accompanying drawings.

FIG. 1 is a view illustrating the Schottky diode according to an embodiment of the inventive concept.

Referring to FIG. 1, the Schottky diode includes a substrate 10, a core, 20, a shell 30, an insulating interlayer 40, and a metallic layer 50.

The substrate 10 may include a crystal silicon wafer and a glass.

The core 20 may be disposed on the substrate 10. The core 20 may include a first semiconductor nanowire extending vertically to the substrate 10. The first semiconductor nanowire includes an intrinsic semiconductor. According to an embodiment of the inventive concept, the core 20 may include an intrinsic germanium nanowire. The present invention is not limited thereto and thus various embodiments are possible. For example, the core 20 may include a group III-V intrinsic semiconductor nanowire, for example, GaAs, GaN, or InP.

The shell 30 may surround the sidewall of the core 20. The shell 30 may include a second intrinsic semiconductor nanowire. The second intrinsic semiconductor nanowire may have a different energy band gap than the first intrinsic semiconductor nanowire. According to an embodiment of the inventive concept, the shell 30 may include an intrinsic silicon nanowire. The present invention is not limited thereto, and various embodiments are possible. For example, the shell 30 may include a group III-V intrinsic semiconductor nanowire, for example, GaAs, GaN, or InP.

The insulating interlayer 40 may surround the shell 30. According to an embodiment of the inventive concept, the insulating interlayer 40 may include a dielectric layer. For example, the insulating interlayer 40 may include a silicon oxide layer or a silicon nitride layer.

The metallic layer 50 may be disposed on the core 20, the shell 30, and the insulating interlayer 40. For example, the metallic layer 50 may include at least one of Au, Ag, Al, Pt, Co, Cu, Fe, Ni, Ti, Sn, Cr, Mo, W, Mg, and Pb.

The metallic layer 50 may contact the core 20 and the shell 30. The metallic layer 50 and the core 20 may have a Schottky junction. The Schottky junction may have the rectification character of voltage-current according to a difference in work functions of the metallic layer 50 and the core 20. Once a forward voltage is applied to the core 20, a current flows well between the core 20 and the metallic layer 50. On the contrary, once a reverse voltage is applied to the core 20, no current, ideally, flows.

The metallic layer 50 and the core 20 may have respectively different work function and Fermi energy levels. When the metallic layer 50 and the core 20 contact each other, the Fermi energy levels may be adjusted identically. However, the Fermi level may bend at the junction interface between the metallic layer 50 and the core 20.

In relation to the Schottky junction, a Fermi energy level at the junction interface may be defined as being disposed below a valence band of the core 20 or right above the valence band. When the Fermi energy level of the core 20 is disposed below or right above the valence band of the core 20, the core 20 may have the same effect as a p-type semiconductor.

The Fermi energy level of the core 20 may be adjusted by the shell 30. Adjusting the Fermi energy level of the core 20 by using the shell 30 is described with reference to FIGS. 2 and 3.

Figure 2:
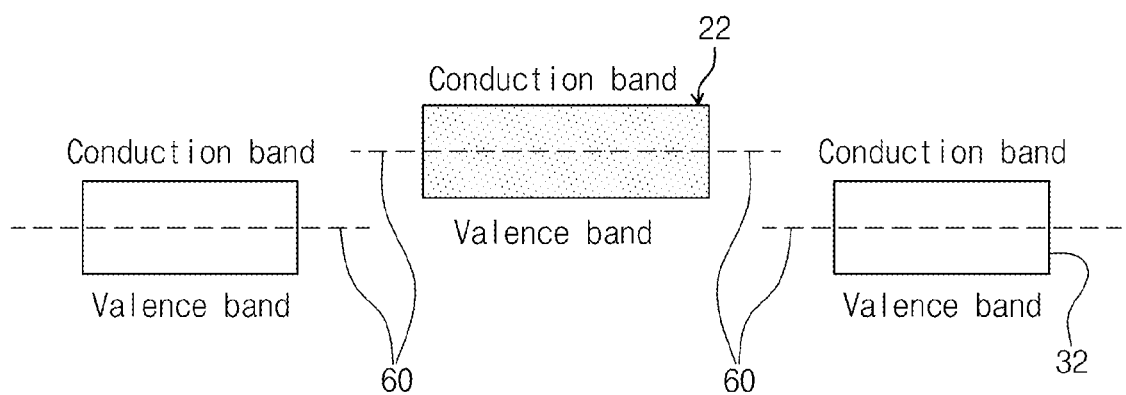
FIG. 2 is a view illustrating first and second energy bands and Fermi energy levels when a core and a shell are separated from each other.

FIG. 2 is a view illustrating first and second energy bands 22 and 32, and Fermi energy levels 60 when the core 20 and the shell 30 are separated from each other.

Referring to FIGS. 1 and 2, the core 20 may have a first energy band gap 22. The Fermi energy level 60 of the core 20 may be disposed between the valence band and the conduction band of the first energy band gap 22.

The shell 30 may have a second energy band gap 32 different from the first energy band gap 22. The Fermi energy level 60 of the shell 30 may be disposed between the valence band and the conduction band of the second energy band gap 32.

In the case of an intrinsic semiconductor nanowire, the Fermi energy level 60 may be located near the center of the valence band and the conduction band. The Fermi energy level 60 of the shell 30 may be being at the center of the valence band and the conduction band. However, the core 20 and the shell 30 may have different Fermi energy levels 60.

Figure 3:
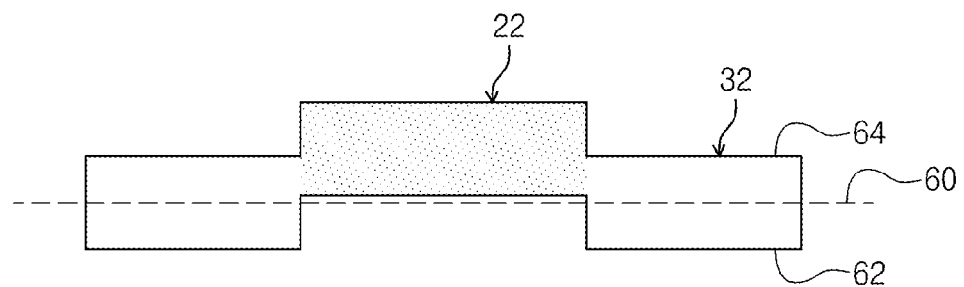
FIG. 3 is a view illustrating a Fermi energy level when a core and a shell are coupled.

FIG. 3 is a view illustrating the Fermi energy level 60 when the core 20 and the shell 30 are coupled.

Referring to FIGS. 1 and 3, when the core 20 and the shell 30 are coupled to each other, the core 20 and the shell 30 may have the same Fermi energy level 60.

The core 20 and the shell 30 may have a metallurgical junction. Due to this, the valence bands of the core 20 and the shell 30 may be connected to each other. For example, the reference numeral of a continuous valence band of the core 20 and the shell 30 may be indicated with 62. Additionally, the conduction bands of the core 20 and the shell 30 may be connected to each other. The reference numeral of the continuous conduction band of the core 20 and the shell 30 may be indicated with 64. The continuous valence band 62 and the continuous conduction band 64 may maintain the first energy band gap 22 and the second energy band gap 32 as there are.

Nevertheless, the Fermi energy level 60 may change in the first energy band gap 22 and the second energy band gap 32. The Fermi energy level 60 of the core 20 may change by the shell 30. Accordingly, the core 20 and the shell 30 may have a staggered heterojunction structure.

The Fermi energy level 60 of the core 20 may move to the maximum energy level of the valence band. The core 20 may have the same effect as if it was doped with p-type impurity. Although not shown in the drawing, when the Fermi energy level 60 moves to the minimum energy level of the conduction band, the core 20 may have the same effect as if it was doped with an n-type impurity.

When a change of the Fermi energy level 60 becomes more distinctive, the final Fermi energy of a heterojunction may be disposed in a valence band or a conduction band. Charges in a valence band of p-type semiconductor and a conduction band of n-type one may be called electron gas and hole gas. Referring to FIG. 3, the Fermi energy level 60 may be disposed below the valence band 62 in the first energy band gap 22, such that the hole gas may be formed. Accordingly, the core 20 may deliver the hole gas.

Since the Fermi energy level 60 of the core 20 is below or right above the valence band, the metallic layer 50 and the core 20 may have the p-type Schottky junction. The shell 30 may adjust the Fermi energy level 60 of the core 20. Accordingly, the junction of the core 20 and the metallic layer 50 may form a Schottky diode even with no impurity.

A method of fabricating the Schottky diode according to an embodiment of the inventive concept is described below.

Figure 4:
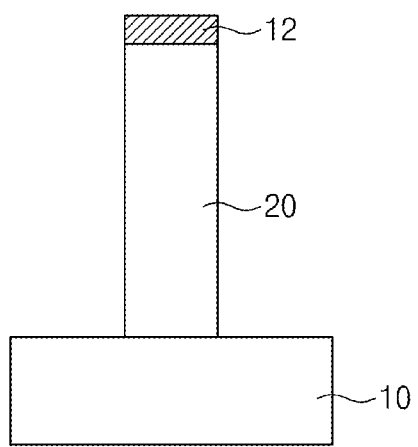
FIGS. 4 to 6 are manufacturing process sectional views illustrating a method of fabricating the Schottky diode according to an embodiment of the inventive concept.
Figure 5:
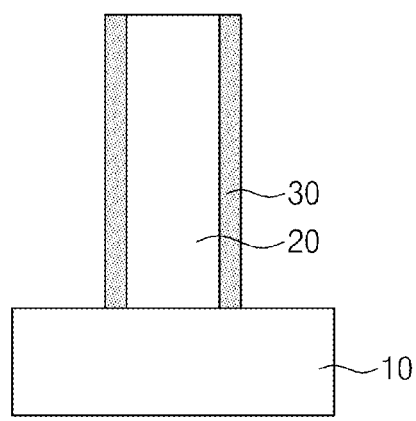
Figure 6:
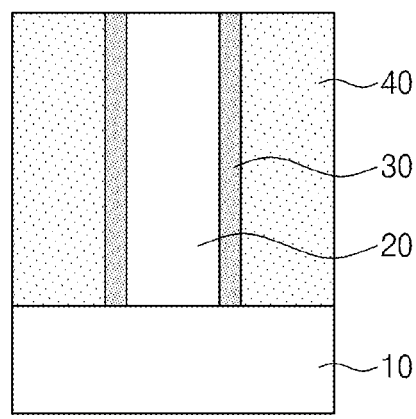

FIGS. 4 to 6 are manufacturing process sectional views illustrating a method of fabricating the Schottky diode according to an embodiment of the inventive concept.

Referring to FIG. 4, the core 20 is formed on the substrate 10. The core 20 may include a first semiconductor nanowire formed through a vapor-liquid-solid (VLS) method or similar ones. The VLS method is a method of growing the core 20 by using a seed 12 and a source gas (not shown). When the source gas is introduced to the substrate 10 and the seed 12 on the substrate 10, some portion of the seed that is usually metal may change into liquid according to phase diagram of the metal seed and substrate. The seed 12 may include Au or Pt. The present invention is not limited thereto. The core 20 may be formed through another growth mechanism. The seed 12 may be removed through a dry or wet etch method after the forming of the core 20.

Referring to FIGS. 3 and 5, the shell 30 is formed on the sidewall of the core 20. The shell 30 may include a second semiconductor nanowire formed through a chemical vapor deposition method or an atomic layer deposition method. The shell 30 may grow along the sidewall. As mentioned above, the shell 30 may adjust the Fermi energy level 60 of the core 20. Due to the shell 30 a impurity doping process of the core 20 may be omitted. Accordingly, without being doped with a impurity, the core 20 may have the p-type or n-type effect by the shell 30.

Referring to FIG. 6, the insulating interlayer 40 is formed on the substrate 10 around the shell 30. The insulating interlayer 40 may include a dielectric layer formed through a physical vapor deposition method, a chemical vapor deposition method, a spin coating method, or a sol-gel method.

Referring to FIG. 1 again, the metallic layer 50 is formed on the core 20, the shell 30, and the insulating interlayer 40.

The metallic layer 50 may be formed through a sputtering method or a thermal deposition method. The metallic layer 50 may form Schottky-contact with the core 20.

Figure 7:
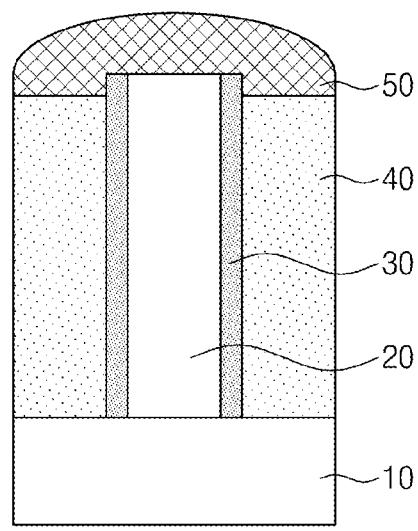
FIG. 7 is a sectional view illustrating the Schottky diode according to a first application of the present invention.

FIG. 7 is a sectional view illustrating the Schottky diode according to a first application of the present invention.

Referring to FIG. 7, the Schottky diode includes the metallic layer 50 formed from a top of the core 20 and shell 30 to the sidewall of the shell 30.

The insulating interlayer 40 may be formed lower than the core 20 and the shell 30. The insulating interlayer 40 may not be easily formed to have the same height as the core 20 and the shell 30 in terms of a manufacturing process. The insulating interlayer 40 may be disposed below the sidewall bottom of the shell 30. The sidewall top of the shells 30 may be exposed from the insulating interlayer 40. The metallic layer 50 may cover the sidewall top of the shell 30. According to the first application of the present invention, the metallic layer 50 extends to the sidewall of the shell 30.

Figure 8:
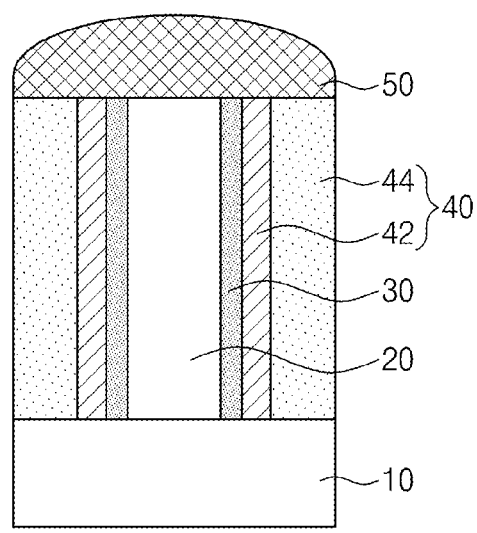
FIG. 8 is a sectional view illustrating the Schottky diode according to a second application of the present invention.

FIG. 8 is a sectional view illustrating the Schottky diode according to a second application of the present invention.

Referring to FIG. 8, the Schottky diode includes an insulating interlayer including a first insulating layer 42 and a second insulating layer 44.

The first insulating layer 42 may surround the sidewall of the shell 30. The second insulating layer 44 may surround the sidewall of the first insulating layer 42. The first insulating layer 42 and the second insulating layer 44 may improve the electrical insulation effect of the core 20 and the shell 30. The present invention is not limited thereto, and thus various embodiments are possible. For example, a third insulating layer may be disposed on the sidewall of the second insulating layer 44. According to the second application, the insulating interlayer 40 is divided into the first insulating layer 42 and the second insulating layer 44.

Figure 9:
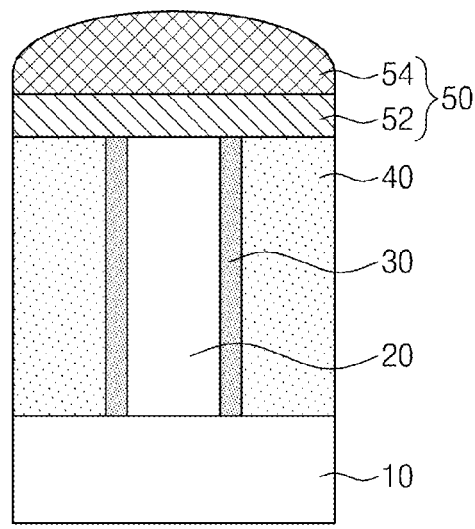
FIG. 9 is a sectional view illustrating the Schottky diode according to a third application of the present invention.

FIG. 9 is a sectional view illustrating the Schottky diode according to a third application of the present invention.

Referring to FIG. 9, the Schottky diode includes the metallic layer 50 including a first metallic layer 52, a second metallic layer 54.

The first metallic layer 52 may be disposed on the core 20, the shell 30, and the insulating interlayer 40. The first metallic layer 52 may form the Schottky junction for the core 20. The second metallic layer 54 may be disposed on the first metallic layer 52. The second metallic layer 54 may have a higher conductivity than the first metallic layer 52. According to the third application, the metallic layer 50 is divided into the first metallic layer 52 and the second metallic layer 54.

Figure 10:
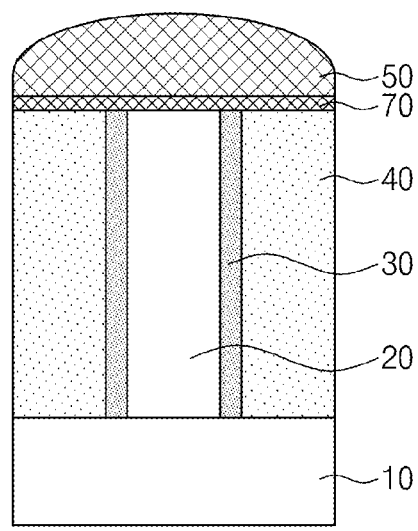
FIG. 10 is a sectional view illustrating the Schottky diode according to a fourth application of the present invention.

FIG. 10 is a sectional view illustrating the Schottky diode according to a fourth application of the present invention.

Referring to FIG. 10, the Schottky diode includes an interfacial layer 70 on the core 20, the shell 30, and the insulating interlayer 40.

The metallic layer 50 may be disposed on the interfacial layer 70. The interfacial layer 70 may induce the Schottky junction of the metallic layer 50 and the core 20. The interfacial layer 70 may adjust the energy barrier of the Schottky junction. The interfacial layer 70 may include a dielectric layer. The interfacial layer 70 may have a thickness of a few nanometers to tens of nanometers. According to the fourth application, the interfacial layer 70 may be further included between the metallic layer 50 and the core 20.

Figure 11:
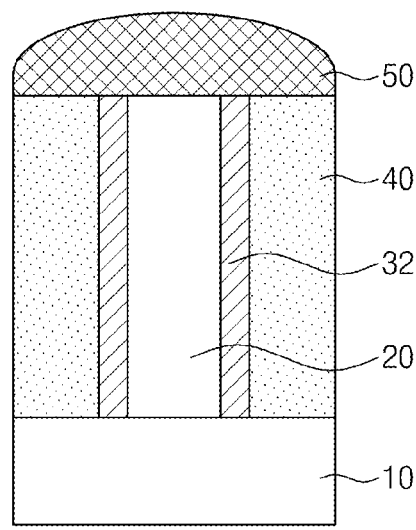
FIG. 11 is a sectional view illustrating the Schottky diode according to a fifth application of the present invention.

FIG. 11 is a sectional view illustrating the Schottky diode according to a fifth application of the present invention.

Referring to FIGS. 3 and 11, the Schottky diode includes the shell 30 of a dielectric layer surrounding the core 20.

The shell 30 of a dielectric layer may induce the variable surface pinning effect or the Fermi energy pinning effect with respect to the core 20, so that it move the Fermi energy level 60 of the core 20 to the inside of the continuous conduction band 64 or the continuous valence band 62. The core 20 may have an effect as if it was doped with a impurity. According to the fifth application, the shell 30 is a dielectric layer.

According to the embodiments of the inventive concept, the Schottky diode includes a core, a shell surrounding the core, and a metallic layer on the shell and the core. The core and the shell may have a Fermi energy level changing due to a staggered heterojunction structure. The Fermi energy level may exist in a valence band or a conduction band of the core. The core may have an effect as if it was doped with a impurity without real extrinsic doping. The metallic layer and the core may consequently have the Schottky junction.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A Schottky diode comprising:
    a substrate;
    a core on the substrate;
    a metallic layer on the core; and
    a shell surrounding the core between the metallic layer and the substrate and adjusting a Fermi energy level of the core to form a Schottky junction between the core and the metallic layer,
    wherein the core comprises a first semiconductor nanowire, and
    wherein the shell comprises a second semiconductor having a different energy band gap from the first semiconductor nanowire and forming a heterojunction structure staggered with the first semiconductor nanowire.

2. The diode of claim 1, wherein the first semiconductor nanowire extends vertically to the substrate.

3. The diode of claim of 1, wherein each of the first semiconductor nanowire and the second semiconductor comprises an intrinsic semiconductor.

4. The diode of claim 1, wherein the second semiconductor comprises an intrinsic silicon nanowire.

5. The diode of claim 1, wherein the first semiconductor nanowire comprises an intrinsic germanium nanowire.

6. The diode of claim 1, wherein the first semiconductor nanowire comprises an intrinsic germanium nanowire or an intrinsic silicon nanowire of which Fermi energy level is adjusted by the surface pinning effect or the surface Fermi energy pinning effect.

7. The diode of claim 1, further comprising at least one insulating interlayer disposed between the metallic layer and the substrate to surround the shell.

8. The diode of claim 7, wherein the insulating interlayer comprises a first insulating layer surrounding a sidewall of the shell and a second insulating layer surrounding a sidewall of the first insulating layer.

9. The diode of claim 1, wherein the metallic layer extends from a top of the core and the shell to an external sidewall of the shell.

10. The diode of claim 1, further comprising an interfacial layer disposed between the core and the metallic layer.

11. A Schottky diode comprising:
    a substrate;
    a core on the substrate;
    a metallic layer on the core; and
    a shell surrounding the core between the metallic layer and the substrate and adjusting a Fermi energy level of the core to form a Schottky junction between the core and the metallic layer,
    wherein the metallic layer comprises:
    a first metallic layer on the core and the shell; and
    a second metallic layer on the first metallic layer,
    wherein the first metallic layer forms the Schottky junction with respect to the core and the shell.

12. A method of fabricating a Schottky diode, the method comprising:
    forming a core on a substrate;
    forming a shell surrounding the core; and
    forming a metallic layer on the shell and the core,
    wherein the core forms a Schottky junction with the metallic layer by adjusting a Fermi energy level through the shell and the core is not doped with an impurity
    wherein the core comprises a first semiconductor nanowire, and
    wherein the shell comprises a second semiconductor having a different energy band gap from the first semiconductor nanowire and forming a heterojunction structure staggered with the first semiconductor nanowire.

13. The method of claim 12, wherein the first semiconductor nanowire is formed through a vapor-liquid-solid (VLS) growth method.

14. The method of claim 12, wherein the second semiconductor is formed through a chemical vapor deposition method or an atomic layer deposition method.

15. The method of claim 12, further comprising forming an insulating interlayer surrounding the shell.

* * * * *

UNITED STATES PATENT AND TRADEMARK OFFICE
CERTIFICATE OF CORRECTION

PATENT NO. : 9,508,873 B2
APPLICATION NO. : 14/339915
DATED : November 29, 2016
INVENTOR(S) : Suh et al.

It is certified that error appears in the above-identified patent and that said Letters Patent is hereby corrected as shown below:

In the Specification

Column 1, Line 11, add the following two paragraphs:
"This invention was made with government support under grant ECCS1202126 awarded by the U.S. National Science Foundation. The government has certain rights in the invention.
This invention was made also with Korean government support under Project No. M0000229."

Signed and Sealed this
Fourth Day of April, 2017

Michelle K. Lee
*Director of the United States Patent and Trademark Office*